(12) United States Patent
Painter et al.

(10) Patent No.: US 10,837,796 B2
(45) Date of Patent: Nov. 17, 2020

(54) GYROSCOPE SENSITIVITY CALIBRATION

(71) Applicant: Apple Inc., Cupertino, CA (US)

(72) Inventors: Christopher C. Painter, Dublin, CA (US); See-Ho Tsang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 19 days.

(21) Appl. No.: 16/147,088

(22) Filed: Sep. 28, 2018

(65) Prior Publication Data

US 2019/0277656 A1    Sep. 12, 2019

Related U.S. Application Data

(60) Provisional application No. 62/639,458, filed on Mar. 6, 2018.

(51) Int. Cl.
  *G01C 25/00*    (2006.01)
  *G01C 19/5712*  (2012.01)
  *G01C 19/5776*  (2012.01)

(52) U.S. Cl.
  CPC ....... *G01C 25/005* (2013.01); *G01C 19/5712* (2013.01); *G01C 19/5776* (2013.01); *B81B 2201/0242* (2013.01); *B81B 2203/04* (2013.01)

(58) Field of Classification Search
  CPC .............. G01C 25/005; G01C 19/5712; G01C 19/5776
  See application file for complete search history.

(56) References Cited

U.S. PATENT DOCUMENTS

| | | | |
|---|---|---|---|
| 8,726,717 B2* | 5/2014 | Supino ................ | G01C 25/005 73/1.77 |
| 2017/0067932 A1* | 3/2017 | Dar ......................... | G01P 21/00 |
| 2019/0178645 A1* | 6/2019 | Senkal ............... | G01C 19/5776 |
| 2019/0186950 A1* | 6/2019 | Dakshinamurthy . | G01C 25/005 |

* cited by examiner

*Primary Examiner* — Jamel E Williams
(74) *Attorney, Agent, or Firm* — Fish & Richardson P.C.

(57) ABSTRACT

An in-situ calibration system, method and apparatus is disclosed that uses test electrodes to stimulate a proof-mass of a MEMS based gyroscope at a drive frequency as quasi-Coriolis forces to extract the electromechanical gain, and uses a non-resonant carrier signal on the proof-mass to extract the additional changes in the sense and drive capacitance. Additionally, an in-situ calibration system, method and apparatus is disclosed that uses quadrature electrodes to apply a known force stimulus to the proof-mass as part of a calibration procedure, where the known force is applied again after installation into a system or further into the life of the gyroscope. Differences in the proof-mass response to the force are proportional to changes in sensitivity, which allows the sensitivity to be corrected in-field.

5 Claims, 13 Drawing Sheets

GYROSCOPE SENSITIVITY CALIBRATION

CROSS-REFERENCE TO RELATED APPLICATIONS

This application claims priority to U.S. Provisional Patent Application No. 62/639,458, filed Mar. 6, 2018, the entire contents of which are incorporated herein by reference.

TECHNICAL FIELD

This disclosure relates generally to calibrating micro-electrical-mechanical system (MEMS) based gyroscopes.

BACKGROUND

The sensitivity of gyroscopes is normally calibrated by the gyroscope supplier using a known sequence of rotary stimuli. The sensitivity, however, is dependent on a number of electromechanical properties that are strain sensitive and/or change over the life of the gyroscope. As a result, the sensitivity shifts after installation of the gyroscope into the end-user's system or drifts over the life of the gyroscope. Because the true input stimuli into the gyroscope after installation are not observable, it is difficult to conveniently recalibrate the sensitivity of the gyroscope when the gyroscope is deployed in the field.

SUMMARY

An in-situ calibration system, method and apparatus are disclosed for motion-free calibration of a MEMS based gyroscope in-field. In an embodiment, a method of calibrating sensitivity of a MEMS based gyroscope comprises: driving a sense proof-mass of the MEMS based gyroscope with forces at the gyroscope drive frequency to generate quasi-Coriolis forces on the proof-mass; extracting electromechanical gain from MEMS based gyroscope; injecting a non-resonant carrier signal onto the proof-mass to extract additional changes in a sense capacitance and a drive capacitance of the MEMS based gyroscope; and using the additional changes to recalibrate sensitivity of the MEMS based gyroscope.

In an embodiment, a method of calibrating sensitivity of a MEMS based gyroscope comprises: at a first time: driving, by test electrodes, a sense proof-mass of the MEMS based gyroscope with a known force stimulus at the drive frequency; determining a first response of the proof-mass to the known force stimulus; at a second time after the first time: driving, by the test electrodes, the sense proof-mass of the MEMS based gyroscope with a known force stimulus at the drive frequency; determining a second response of the proof-mass to the known force stimulus; determining a difference in first and second responses of the proof-mass to the known force stimulus; and using the difference to recalibrate sensitivity of the MEMS based gyroscope.

Particular implementations disclosed herein provide one or more of the following advantages. The disclosed system and method allows for motion-free, recalibration of MEMS based gyroscope sensitivity over the life of a MEMS based gyroscope in-field.

The details of the disclosed implementations are set forth in the accompanying drawings and the description below. Other features, objects and advantages are apparent from the description, drawings and claims.

DESCRIPTION OF DRAWINGS

The same reference symbol used in various drawings indicates like elements.

DETAILED DESCRIPTION

Overview

In a first embodiment, a calibration system and method is disclosed that uses test electrodes to stimulate a proof-mass of a MEMS based gyroscope at the gyroscope drive frequency as quasi-Coriolis forces to extract the electromechanical gain, and uses a non-resonant carrier signal on the proof-mass to extract the additional changes in the sense and drive capacitance. The supplier of the part would exercise the part in a calibration station to extract baseline gyroscope sensitivity values. After the calibration and before removing the part, the supplier would then run a calibration sequence to measure the electromechanical transfer function of the gyroscope using in-phase test electrodes and the sense and drive-sense capacitances. After installation into a system and/or sometime later in-field, the test sequences described above would be run again, and changes (deltas) to the output would be used to recalibrate the sensitivity of the gyroscope.

In a second embodiment, a calibration system and method is disclosed that uses quadrature electrodes to apply a known force stimulus to a gyroscope proof-mass as part of a calibration procedure, where the known force is applied again after installation into a system or further into the life of the gyroscope. Differences in the proof-mass response to the force are proportional to changes in sensitivity, which allows the sensitivity to be corrected in the field. As with the first embodiment, the calibration may also include a calibration sequence to measure the sense and drive-sense capacitances.

Figure 1:
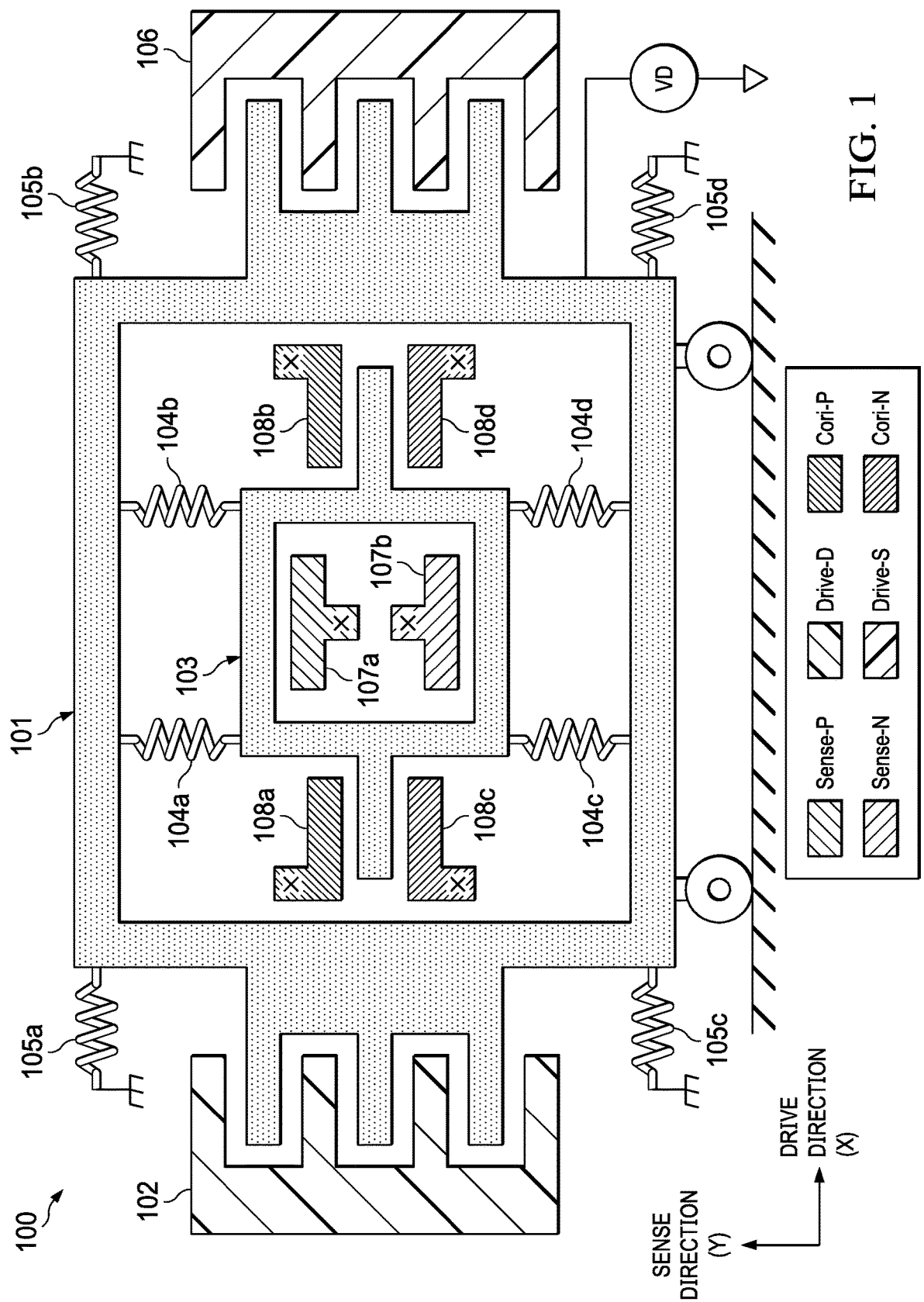
FIG. 1 is an electromechanical model of a gyroscope with additional test electrodes (Cori-P and Cori-N) for calibrating sensitivity of a MEMS based gyroscope using drive feedthrough excitation and capacitance extraction, according to an embodiment.

Gyroscope Sensitivity Calibration Using Drive Feedthrough Excitation and Capacitance Extraction FIG. 1 is an electromechanical model of a calibration system 100 for calibrating sensitivity of a MEMS based gyroscope using drive feedthrough excitation and capacitance extraction, according to an embodiment. Model 100 includes drive mass 101 ($m_D$), drive-drive lateral comb electrodes 102, sense (proof) mass 103 ($m_S$), sense springs 104a-104d ($k_S$), drive springs 105a-105d ($k_D$), drive-sense lateral comb electrodes 106, sense electrodes 107a, 107b and test electrodes 108a-108d (Cori-P, Cori-N).

In normal operation, lateral comb electrodes 102 apply linear electrostatic forces to drive mass 101. For example, a DC bias voltage is applied to drive mass 101 and when an AC drive voltage is applied to lateral combs 102 at the drive frequency of drive mass 101, the linear electrostatic forces excite drive mass 101 to oscillate along the drive axis (X) at the gyroscope's resonant frequency. Drive-sense lateral comb electrodes 106 sense output current from drive mass 101 moving on drive springs 105a-105d. This output current is proportional to the velocity of drive mass 101. Sense mass 103 is disposed within an opening in drive mass 101 and moves on sense springs 104a-104d. Sense electrodes 107a, 107b sense the sense direction (Y) displacement/deflection of sense mass 103 from its baseline position. Electrodes 108a-108d are used to excite drive mass 101 with quasi-Coriolis force, as described further below.

Figure 2:
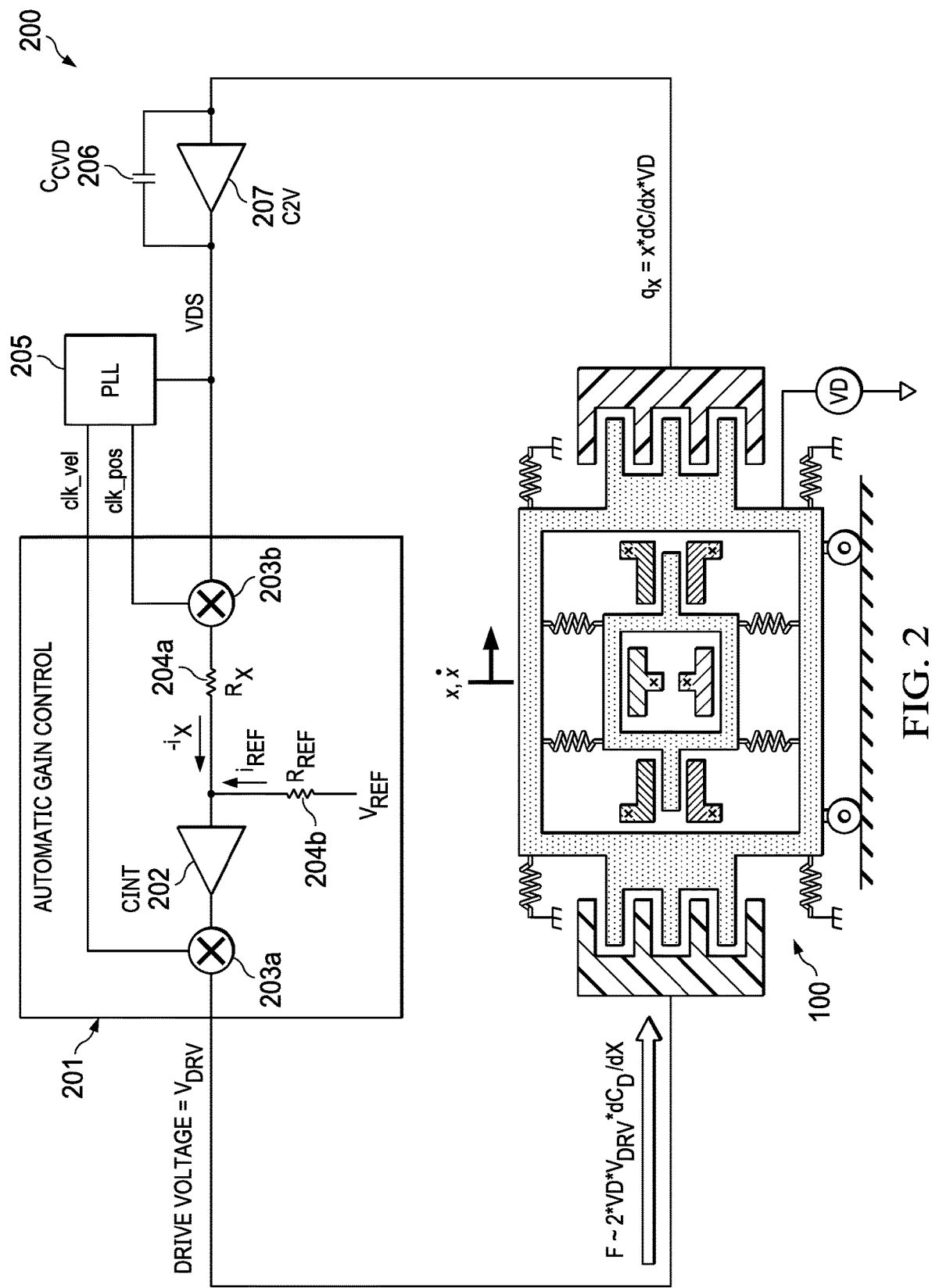
FIG. 2 is a conceptual diagram illustrating a gyroscope drive circuit, according to an embodiment.

FIG. 2 is a conceptual diagram illustrating a gyroscope drive system 200, according to an embodiment. Drive system 200 includes a closed-feedback control loop that includes automatic gain control (AGC) 201, phase-locked loop (PLL) 205 and capacitance-to-voltage (C2V) converter 207. The control loop is configured to maintain a constant velocity of drive mass 101 and to set the amplitude of the drive voltage.

AGC 201 is a closed-loop feedback regulating circuit that is configured to provide a controlled drive voltage ($V_{DRV}$) amplitude at its output. In an embodiment, AGC 201 includes integration amplifier 202 (CINT) and synchronous demodulators 203a, 203b. Integration amplifier 202 is coupled to bias resistors 204a, 204b. PLL 205 generates and provides clock signals clk_vel and clk_pos to demodulators 203a, 203b, respectively. C2V converter 207 converts a varying capacitive charge $q_x$ (coulombs) to a voltage signal (VDS), where $q_x$ is caused by displacement/deflection x of sense mass 103 from its baseline position. C2V converter 207 includes feedback capacitor 206 ($C_{CVD}$) that integrates motion induced current from the drive-sense combs into voltage VDS. VDS is provided to an input of PLL 205 as a reference signal for generating clocks clk_vel, clk_pos. Demodulator 203b demodulates the displacement/deflection of sense mass 103 using clk_pos. The output of demodulator 203b is compared to $V_{REF}$ to produce an error signal. This error signal is integrated with integrator 202 and then remodulated at drive frequency by mixing with the PLL clk_vel signal to produce drive voltage $V_{DRV}$.

In normal operation, system 200 provides a force $F_{DRV}$ on drive mass 101 given by:

$$F_{DRV} \sim 2VD * V_{DRV} * \frac{dC_D}{dX}, \quad [1]$$

where $C_D$ is the drive capacitance, x is the displacement of drive mass 101 from its baseline position, and VD is the bias voltage on the proof mass.

The varying capacitive charge $q_x$ (coulombs) due to the displacement/deflection x of sense mass 103 is given by:

$$q_x = x * \frac{dC}{dx} * VD, \quad [2]$$

where, $$\frac{dC}{dx},$$

is the change in the drive-sense capacitance C due to the displacement/deflection x of drive mass 101.

Equations [3]-[6] further describe drive system 200 and the mechanical sensitivity of the gyroscope as follows:

$$\frac{y}{\Omega} = \frac{X}{4\pi^2 \Delta f \left(1 - \frac{\Delta f}{f_{DRV}}\right)}, \quad [3]$$

$$i_{REF} = i_x, \quad [4]$$

$$V_{REF} = \frac{R_{REF}}{R_x} V_x, \quad [5]$$

$$V_{REF} = \frac{R_{REF}}{R_x} \frac{q_x}{C_{CVD}}, \quad [6]$$

$$V_{REF} = \frac{R_{REF}}{R_x} \frac{X}{C_{CVD}} \frac{dC}{dx} VD, \quad [7]$$

$$x = \frac{R_x}{R_{REF}} \frac{C_{CVD}}{\frac{dC}{dx}} \frac{V_{REF}}{VD}, \quad [8]$$

where Ω is the actual angular rate, $f_{DRV}$ is the gyroscope drive frequency, Δf is the delta frequency between drive and sense modes, and y is the sense displacement.

Figure 3:
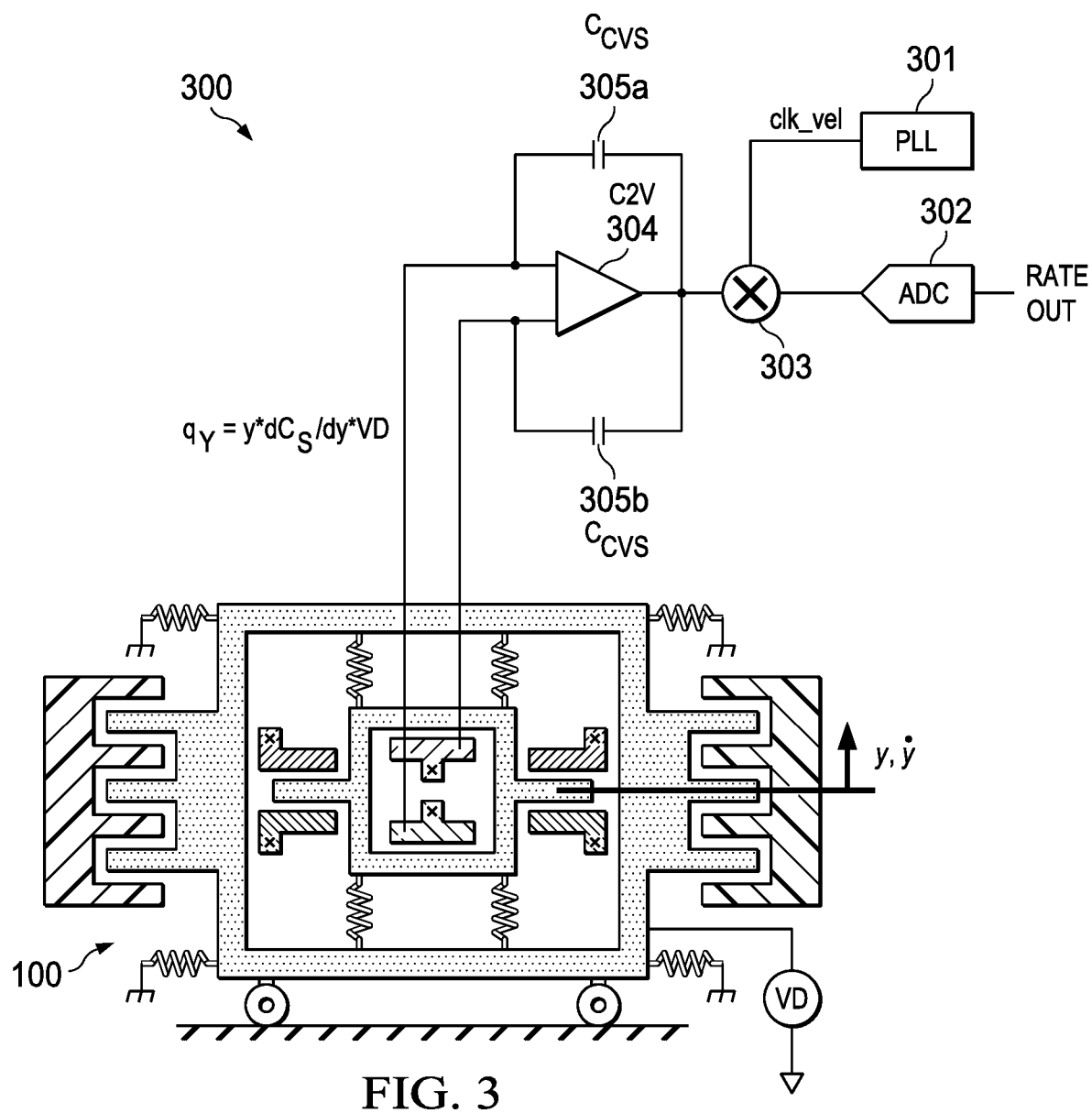
FIG. 3 is a diagram illustrating a gyroscope sense circuit, according to an embodiment.

FIG. 3 is a diagram illustrating gyroscope sense system 300, according to an embodiment. Sense system 300 includes PLL 301, analog-to-digital (ADC) 302, demodulator 303 and C2V converter 304. C2V converter 304 further includes feedback capacitors 305a, 305b ($C_{CVS}$).

The varying capacitive charge $q_y$ (coulombs) due to the displacement/deflection y of sense mass 103 is given by:

$$q_y = y * \frac{dC_S}{dy} * VD, \quad [9]$$

where $C_S$ is the sense capacitance from the sense electrodes 107a, 107b.

Equations [10]-[12] further describe sense system 300 and electromechanical sensitivity as follows:

$$\frac{y}{\Omega} = \frac{X}{4\pi^2 \Delta f \left(1 - \frac{\Delta f}{f_{DRV}}\right)},$$ [10]

$$\frac{\text{Rate\_Out}}{\Omega} = \frac{X}{4\pi^2 \Delta f \left(1 - \frac{\Delta f}{f_{DRV}}\right)} \frac{dC_S}{dy} VD \frac{1}{C_{CVS}},$$ [11]

$$\frac{\text{Rate\_Out}}{\Omega} = \frac{X}{4\pi^2 \Delta f \left(1 - \frac{\Delta f}{f_{DRV}}\right)} \frac{\frac{dC_S}{dy}}{\frac{dC}{dx}} \frac{C_{CVD}}{C_{CVS}} \frac{R_x}{R_{REF}} V_{REF},$$ [12]

where Rate_Out is the measured angular rate, $C_{CVS}$ is the offset sense capacitance and $\Omega$ is the actual angular rate. Note that the gyro sensitivity $$\frac{\text{Rate\_Out}}{\Omega}$$

depends on many parameters and drift in any one of these parameters causes a sensitivity drift.

Sense system 300 is configured to extract varying capacitance $q_y$ due to y displacement/deflection of sense mass 103. Differential sense electrodes 107a, 107b generate varying capacitive charge $q_y$, which is converted to an analog voltage signal by C2V converter 304. The analog voltage signal is demodulated by synchronous demodulator 303, which is coupled to clock signal clk_vel generated and provided by PLL 301. Demodulator 303 extracts an analog rate signal from the analog voltage signal. The analog rate signal is converted to a digital rate signal by ADC 302 to produce the measured digital rate signal Rate_Out.

Figure 4A:
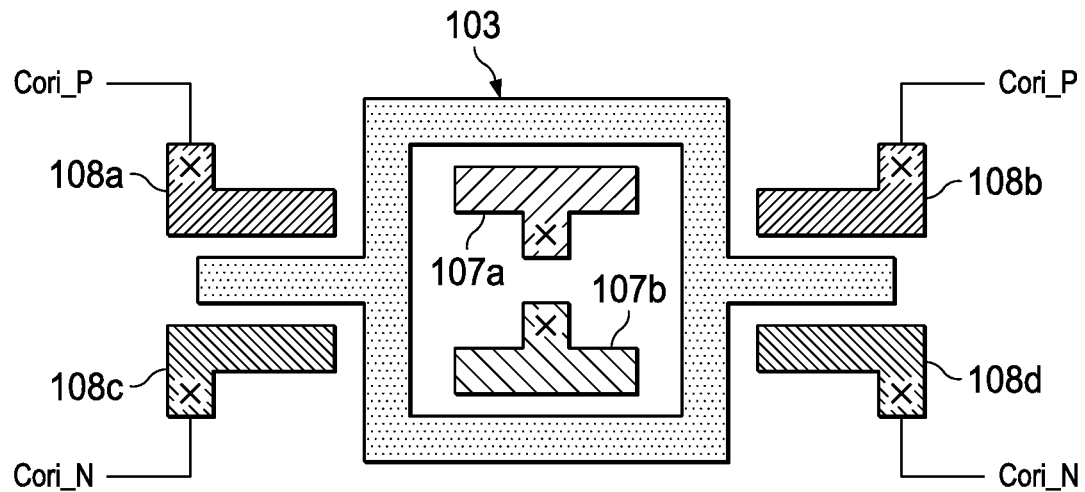
FIGS. 4A and 4B illustrates drive feedthrough calibration using a drive sense capacitance-to-voltage (C2V) converter output to generate the quasi-Coriolis excitation forces on the test electrodes, according to an embodiment.
Figure 4B:
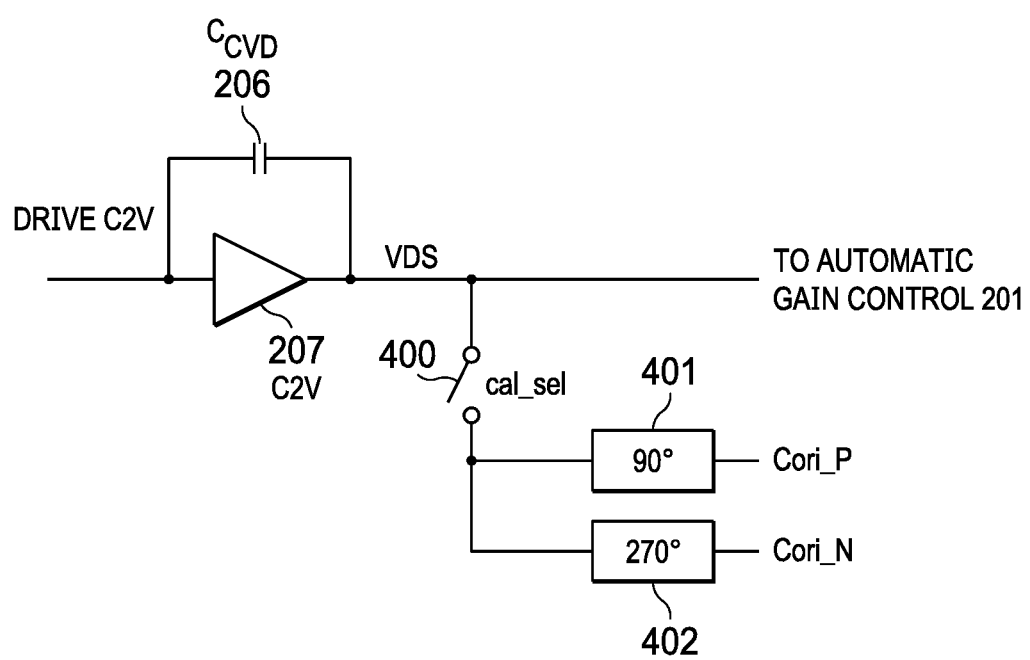

FIGS. 4A and 4B illustrate drive feedthrough quasi-Coriolis excitation, according to an embodiment. Differential Coriolis excitation signals (Cori_P, Cori_N) are applied to differential test electrodes 108a-108d to generate quasi-Coriolis excitation forces on sense mass 103. In an embodiment, the Coriolis excitation signals (Cori_P, Cori_N) can be generated from drive system 200. For example, switch 401 can be controlled by switch selection signal (cal_sel) to generate Coriolis excitation signals that have 90° and 270° phases relative to the phase of the output voltage VDS of C2V 207. In an embodiment, cal_sel can be generated by logic implemented in hardware (e.g., an ASIC) and/or software.

Equations [13]-[15] further describe the generation of a Rate_Out when quasi-Coriolis excitation is applied:

$$V_{DS} = \frac{R_x}{R_{REF}} V_{REF},$$ [13]

$$F_{Cori} = 4 \frac{dC_S}{dy} V_D V_{DS},$$ [14]

$$\text{Rate\_Out} \sim \frac{\frac{4}{f_{DRV} m_S} \frac{dC_S}{dy} V_D V_{DS}}{4\pi^2 \Delta f \left(1 - \frac{\Delta f}{f_{DRV}}\right)} \frac{dC_S}{dy} V_D \frac{1}{C_{CVS}},$$ [15]

where $F_{Cori}$ is the electrostatic force generated by the quasi-Coriolis excitation and $m_S$ is the sense mass 103.

Referring to Equation [15], there are several drawbacks with using drive feedthrough quasi-Coriolis excitation: 1) sensitivity change due to a change in drive capacitance (dC/dx) is not observable, 2) the change in sense capacitance ($dC_S/dy$) varies to the second power and 3) output varies with bias voltage.

Figure 5:
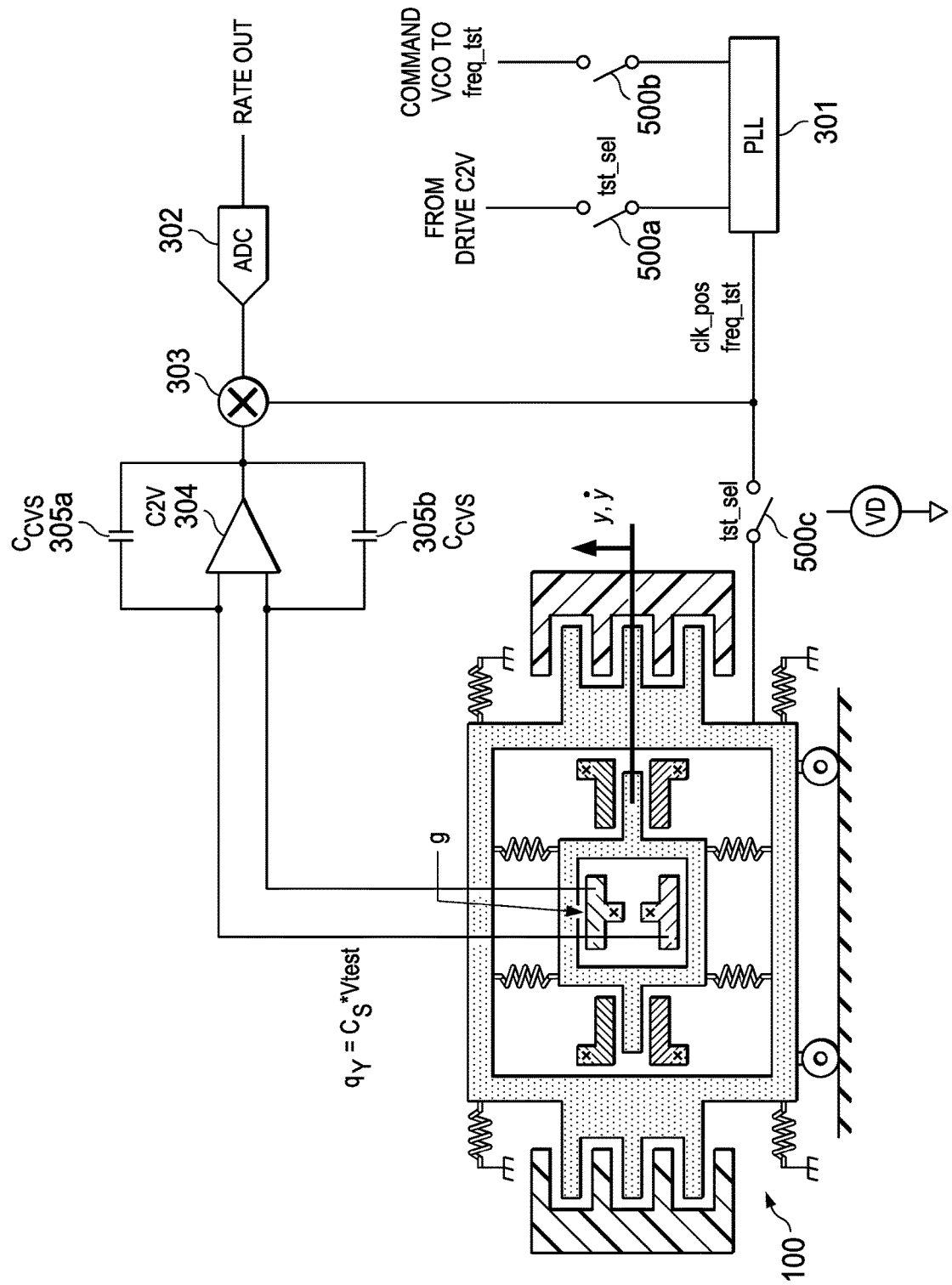
FIG. 5 illustrates identifying unknown sense capacitance, according to an embodiment.

FIG. 5 illustrates a method for identifying unknown sense capacitance $C_S$, between the proof mass and the sense electrodes according to an embodiment. In this mode, the gyroscope stops moving and the static capacitance is being measured. In this example embodiment, switch 500c switches the proof mass voltage from DC voltage VD to the output of PLL 301, switch 500a disconnects the PLL from using the drive C2V output, and switch 500b switches PLL 301 to accept commands to set the VCO to a fixed frequency freq_tst. Charge is generated by the PLL voltage on the static capacitance $C_S$ between proof mass 103 and sense electrodes 107a and 107b. The charge is converted to a voltage using sense C2V converter 304. The output of sense C2V converter 304 is demodulated by rate demodulator 303, which uses one of clock signal clk_pos or a frequency test signal (freq_tst) to extract an analog test signal proportional to the capacitance. The clock signal and frequency test signal are generated and provided by PLL 301. The analog rate signal is converted by ADC 302 into a digital test signal (Rate_Out). In an embodiment, switches 500a, 500b, and 500c are controlled by test signal tst_sel, which is generated by logic implemented in hardware (e.g., ASIC) and/or software. In an embodiment, the freq_test signal has a frequency that lies on the flat area (stable or constant frequency range) of a frequency response curve of drive mass 101.

The configuration shown will determine changes in a delta gap g between sense electrodes 107a, 107b (parallel plate electrodes) due to a position change of sense mass 103. In an embodiment, if there is a suspected common mode gap change, sense C2V converter 304 is configured to switch from differential amplification to single-ended amplification and then switch between positive and negative electrodes. In an embodiment, an attenuation stage can be placed between PLL 301 and drive mass 101 (e.g., a divider).

Figure 6:
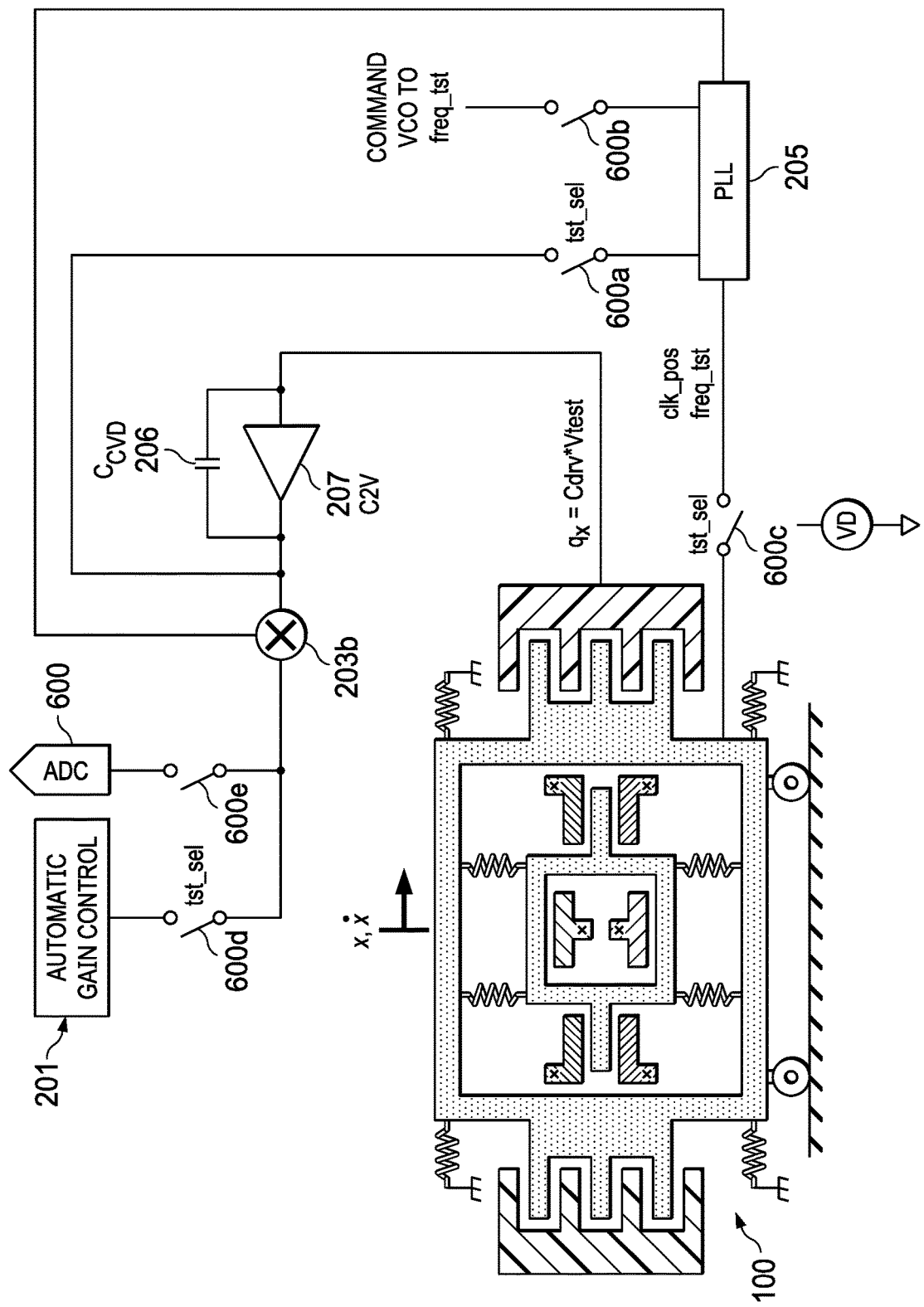
FIG. 6 illustrates identifying unknown drive capacitance, according to an embodiment.

FIG. 6 illustrates identifying unknown drive capacitance C, according to an embodiment. In this mode, the gyroscope is stationary and the static capacitance is being measured. In this example embodiment, switch 600c switches the proof mass voltage from DC voltage VD to the output of PLL 205, switch 600a disconnects the PLL from using the drive C2V output, switch 600b switches PLL 205 to accept commands to set the VCO to a fixed frequency freq_tst, switch 600d disconnects the AGC from the drive loop, and switch 600e connects demodulator 203b output to an ADC. The PLL voltage on the static capacitance C between proof mass 103 and drive-sense electrode 106 generates charge. The charge is converted to a voltage using drive-sense C2V converter 207. The output of drive-sense C2V converter 207 is demodulated by rate demodulator 203b, which uses one of clock signal clk_pos or a frequency test signal (freq_tst) to extract an analog test signal proportional to the capacitance. The analog rate signal is converted by ADC 600 into a digital test signal that is stored in memory for compensating sensitivity due to drive-sense capacitance change. Switches 600a, 600c, 600d and 600e are controlled by the test selection signal (tst_sel). In an embodiment, tst_sel is generated by logic implemented in hardware (e.g., ASIC) and/or software. In an embodiment, freq_test can have a frequency that lies on a flat area of a frequency response curve of drive mass 101.

Figure 7A:
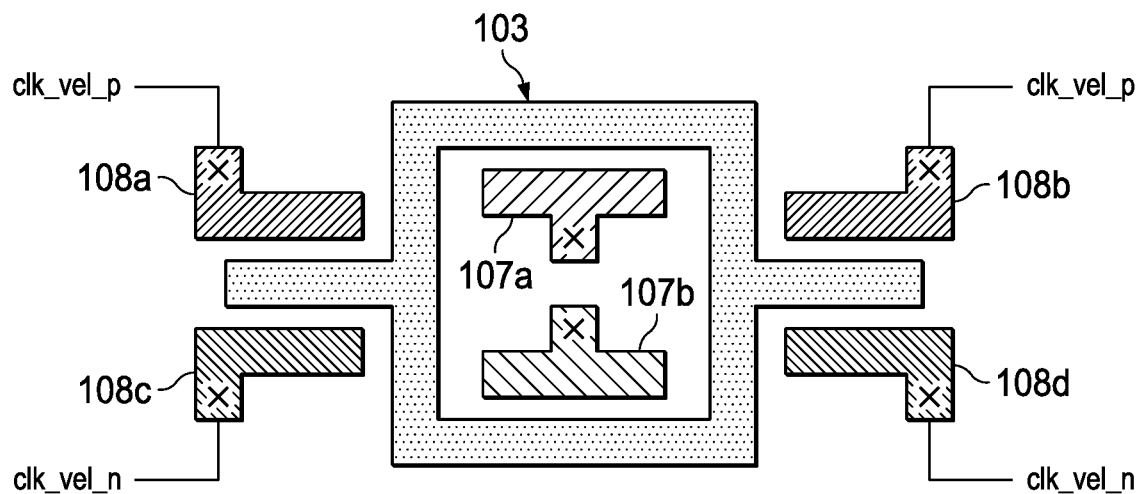
FIGS. 7A and 7B illustrate an example embodiment that uses the drive signal output of the drive a phase-locked loop (PLL) to generate the quasi-Coriolis excitation forces on the test electrodes, according to an embodiment.
Figure 7B:
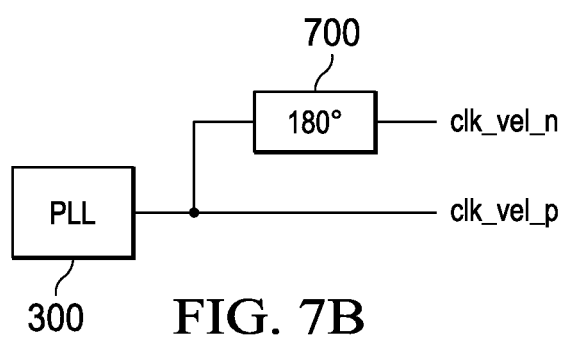

FIGS. 7A and 7B illustrate an example embodiment that uses a PLL to generate velocity clock signals for quasi-Coriolis excitation, according to an embodiment. Referring to FIG. 7A, clock signals (clk_vel_p, clk_vel_n, clk_pos_p, clk_pos_n) are shown being applied to differential electrodes 108a-108d to excite drive mass 101 with quasi-Coriolis forces to induce quasi-Coriolis excitation on sense mass 103. Also shown is sense mass 103 and differential sense electrodes 107a, 107b fore sensing displacement/deflection of sense mass 103. FIG. 7B illustrates an embodiment for generating differential velocity clock signals (clk_vel_p, clk_vel_n) using PLL 301 and phase inverter 700, such that clk_vel_n is 180° out of phase with clk_vel_p. A disadvantage with this design is that the quasi-Coriolis excitation signals are not proportional to drive amplitude.

Gyroscope Sensitivity Calibration Using Electrostatically Induced Quadrature

The embodiment described below uses quadrature test electrodes to apply a known force stimulus to the proof-mass as part of the normal calibration where the known force can then be applied again after installation of the gyroscope in a system or further into the life of the gyroscope. Differences in proof-mass response to the force will be proportional to the changes in sensitivity, which allows the sensitivity to be corrected in-field.

Figure 8:
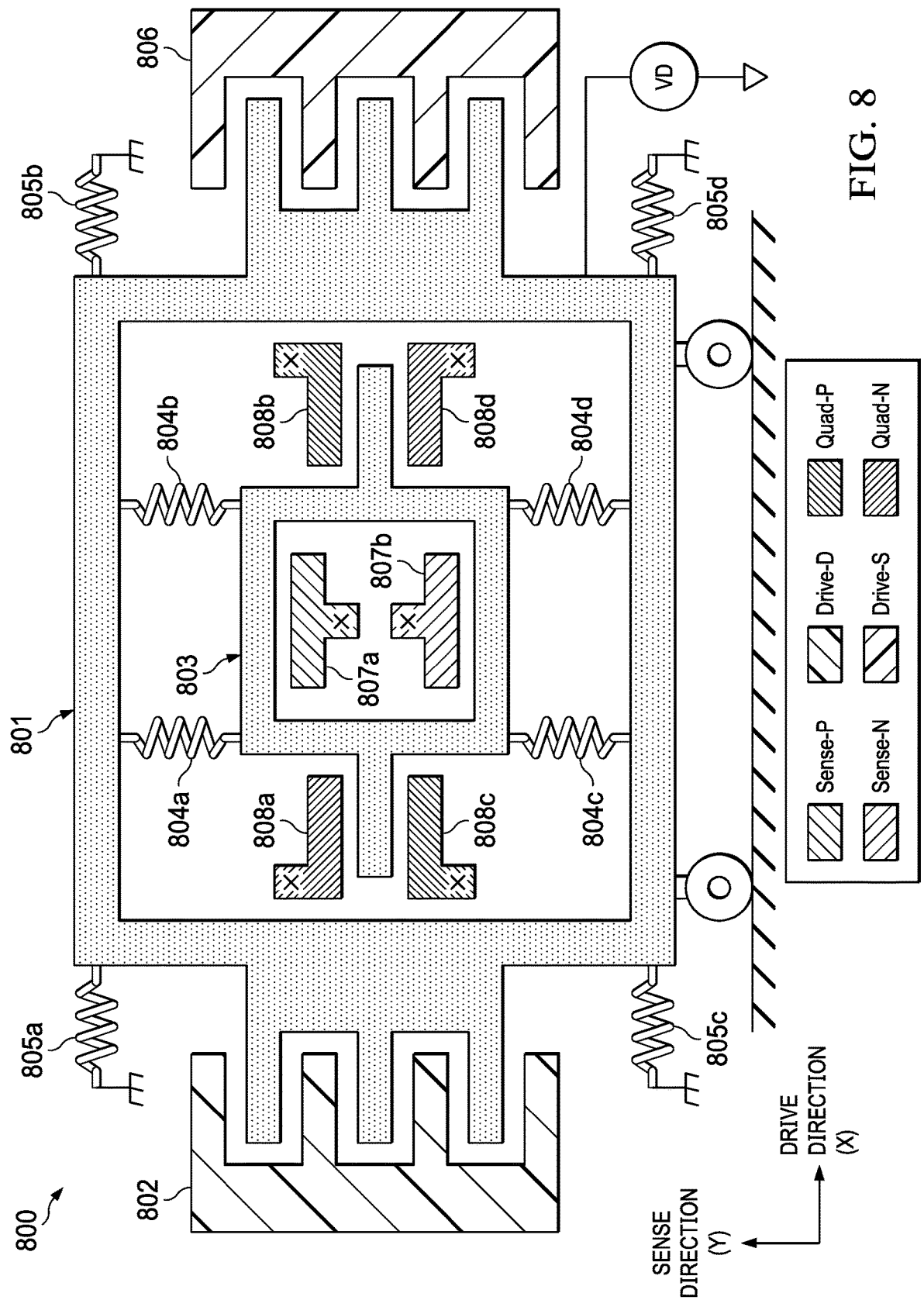
FIG. 8 is an electromechanical model of a gyroscope with additional test electrodes (Quad-P and Quad-N) for calibrating sensitivity of a MEMS based gyroscope using electrostatically induced quadrature and capacitance extraction, according to an embodiment.

FIG. 8 is an electromechanical model 800 for calibrating a MEMS based gyroscope using electrostatically induced quadrature, according to an embodiment. Model 800 includes drive mass 801 ($m_D$), drive-drive lateral comb electrodes 802, sense (proof) mass 803 ($m_S$), sense springs 804a-804d ($k_S$), drive springs 805a-805d ($k_D$), drive-sense lateral comb electrodes 806, sense electrodes 807a, 807b and test electrodes 808a-808d (Quad-P, Quad-N).

In normal operation, lateral comb electrodes 802 apply linear electrostatic forces to drive mass 801. For example, a DC bias voltage is applied to drive mass 801 and when an AC drive voltage is applied to lateral combs 802 at the drive frequency of drive mass 801, the linear electrostatic forces excite drive mass 801 to oscillate along the drive axis (X) at the gyroscope's resonant frequency. Drive-sense lateral comb electrodes 806 sense output current from drive mass 801 moving on drive springs 805a-805d. This output current is proportional to the velocity of drive mass 801. Sense mass 803 is disposed within an opening in drive mass 801 and moves on sense springs 804a-804d. Sense electrodes 807a, 807b sense the sense direction (Y) displacement/deflection of sense mass 103 from its baseline position. Electrodes 808a-808d are used to apply DC control voltages that are modulated by the motion of the drive mass, which applies quasi-Coriolis forces onto mass 803, as described further below.

Figure 9:
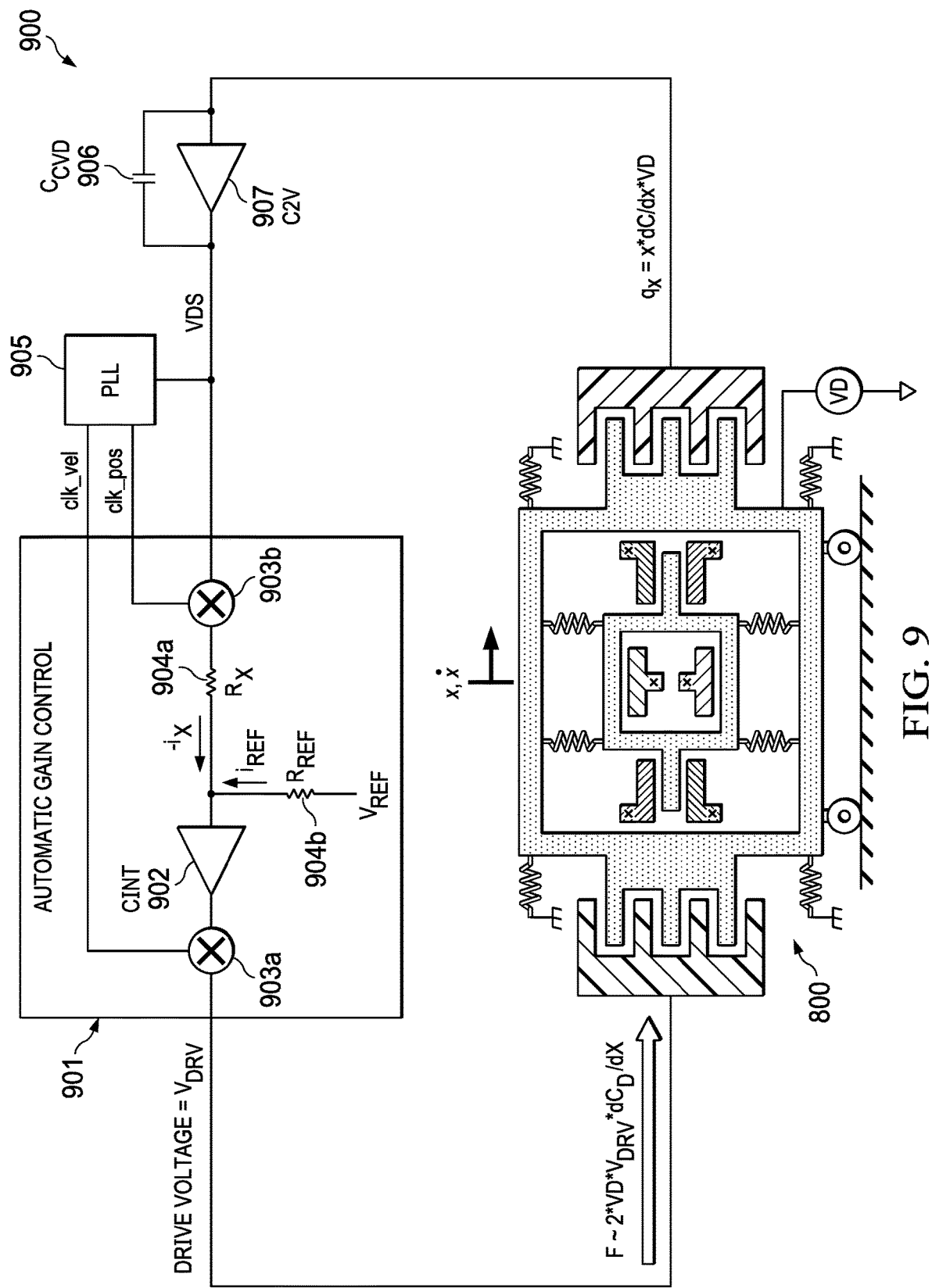
FIG. 9 is a conceptual diagram illustrating a gyroscope drive circuit, according to an embodiment.

FIG. 9 is a conceptual diagram illustrating a gyroscope drive system 900, according to an embodiment. Drive system 900 includes a closed-feedback control loop that includes automatic gain control (AGC) 901, phase-locked loop (PLL) 905 and capacitance-to-voltage (C2V) converter 907. The control loop is configured to maintain a constant velocity of drive mass 801 and to set the amplitude of the drive voltage.

AGC 901 is a closed-loop feedback regulating circuit that is configured to provide a controlled drive voltage ($V_{DRV}$) amplitude at its output. In an embodiment, AGC 901 includes integration amplifier 902 (CINT) and synchronous demodulators 903a, 903b. Integration amplifier 902 is coupled to bias resistors 904a, 904b. PLL 905 generates and provides clock signals clk_vel and clk_pos to demodulators 903a, 903b, respectively. C2V converter 907 converts a varying capacitive charge $q_x$ (coulombs) to a voltage signal (VDS), where $q_x$ is caused by displacement/deflection x of sense mass 803 from its baseline position. C2V converter 907 includes feedback capacitor 906 ($C_{CVD}$) that integrates the input charge into a voltage. VDS is provided to an input of PLL 905 as a reference signal for generating clocks clk_vel, clk_pos. Demodulator 903b demodulates the displacement/deflection of drive mass 801 using clk_pos. The output of demodulator 903b is compared to $V_{REF}$ to product an error signal. This error signal is integrated with integrator 902 and then remodulated at drive frequency by mixing with clk_vel to, produce drive voltage $V_{DRV}$.

In operation, drive system 900 provides a force $F_{DRV}$ on drive mass 101 given by:

$$F_{DRV} \sim 2VD * V_{DRV} * \frac{dC_D}{dX}, \qquad [16]$$

where $C_D$ is the drive capacitance and x is the displacement of drive mass 801 from its baseline position.

The varying capacitive charge $q_x$ due to the displacement/deflection x of drive mass 801 is given by:

$$q_x = x * \frac{dC}{dx} * VD, \qquad [17]$$

where $$\frac{dC}{dx}$$

is the change in sense capacitance C due to the displacement/deflection x of drive mass 801.

Equations [18]-[23] further describe drive system 900 and the mechanical sensitivity of the gyroscope as follows:

$$\frac{y}{\Omega} = \frac{X}{4\pi^2 \Delta f \left(1 - \frac{\Delta f}{f_{DRV}}\right)}, \qquad [18]$$

$$i_{REF} = i_x, \qquad [19]$$

$$V_{REF} = \frac{R_{REF}}{R_x} V_x, \qquad [20]$$

$$V_{REF} = \frac{R_{REF}}{R_x} \frac{q_x}{C_{CVD}}, \qquad [21]$$

$$V_{REF} = \frac{R_{REF}}{R_x} \frac{X}{C_{CVD}} \frac{dC}{dx} VD, \qquad [22]$$

$$x = \frac{R_x}{R_{REF}} \frac{C_{CVD}}{\frac{dC}{dx}} \frac{V_{REF}}{VD}, \qquad [23]$$

where $\Omega$ is the actual angular rate, $f_{DRV}$ is the gyroscope drive frequency, $\Delta f$ is the delta frequency between drive and sense modes, and y is the sense displacement.

Referring to Equations [18]-[23], it is a design goal for displacement/deflection x to remain constant. But the displacement/deflection x is inferred from other measurements that may be prone to error.

Figure 10:
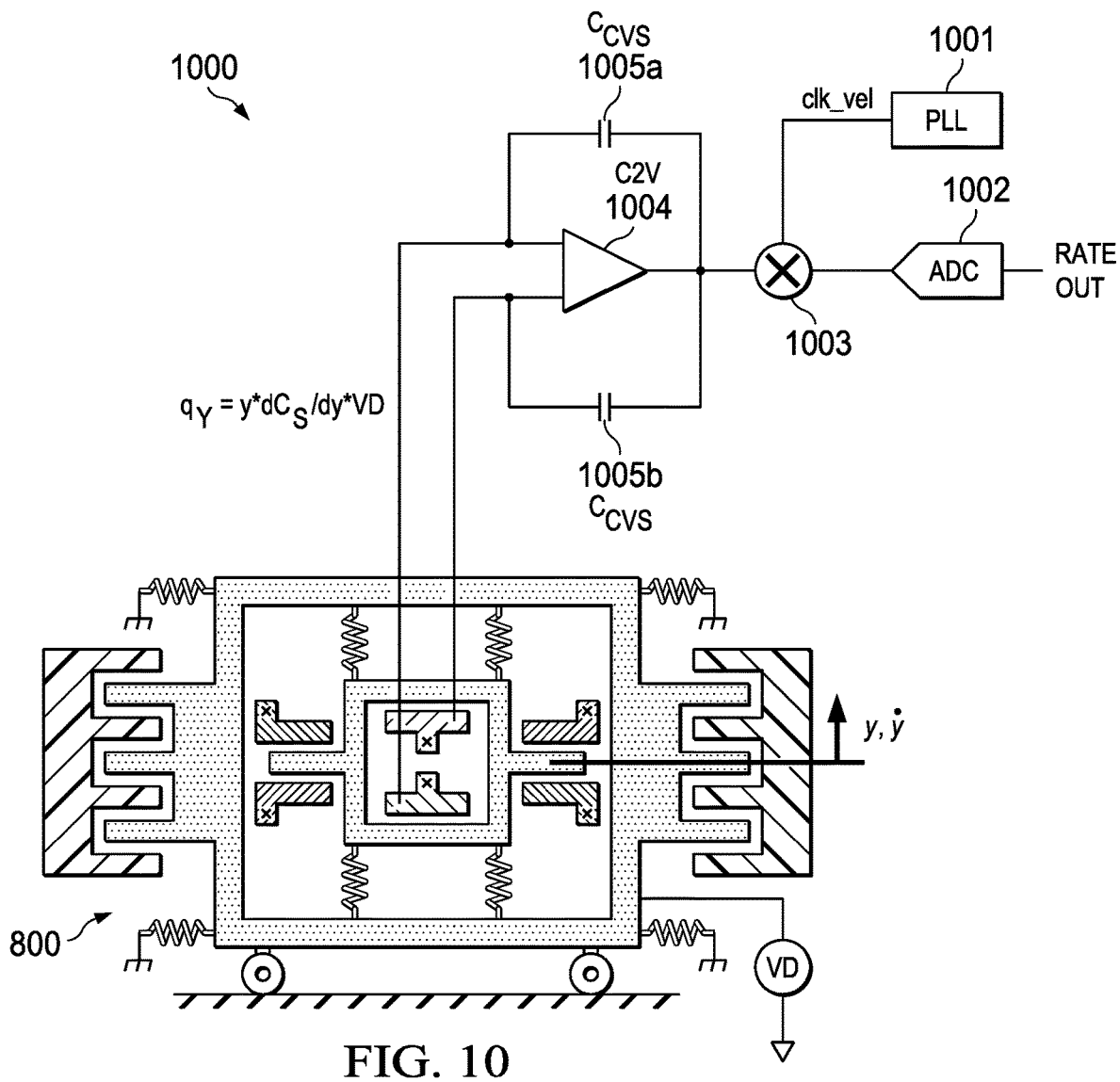
FIG. 10 is a conceptual diagram illustrating a gyroscope sense circuit, according to an embodiment.

FIG. 10 is a diagram illustrating gyroscope sense system 1000, according to an embodiment. Sense system 1000 includes PLL 1001, analog-to-digital (ADC) 1002, demodulator 1003 and C2V converter 1004. C2V converter 1004 further includes capacitors 1005a, 1005b ($C_{CVS}$).

The varying capacitive charge $q_y$ (coulombs) due to the displacement/deflection x of sense mass 803 is given by:

$$q_y = y * \frac{dC_S}{dy} * VD, \quad [24]$$

where $C_S$ is the sense capacitance from the sense electrodes 107a, 107b.

Equations [25]-[27] further describe sense system 300 and the electromechanical sensitivity of the gyroscope as follows:

$$\frac{y}{\Omega} = \frac{X}{4\pi^2 \Delta f \left(1 - \frac{\Delta f}{f_{DRV}}\right)}, \quad [25]$$

$$\frac{Rate\_Out}{\Omega} = \frac{X}{4\pi^2 \Delta f \left(1 - \frac{\Delta f}{f_{DRV}}\right)} \frac{dC_S}{dy} VD \frac{1}{C_{CVS}}, \quad [26]$$

$$\frac{Rate\_Out}{\Omega} = \frac{X}{4\pi^2 \Delta f \left(1 - \frac{\Delta f}{f_{DRV}}\right)} \frac{\frac{dC_S}{dy}}{\frac{dC}{dx}} \frac{C_{CVD}}{C_{CVS}} \frac{R_x}{R_{REF}} V_{REF}, \quad [27]$$

where Rate_Out is the measured angular rate, $C_{CVS}$ is the offset sense capacitance and $\Omega$ is the actual angular rate. Note that the gyro sensitivity $$\frac{Rate\_Out}{\Omega}$$

depends on many parameters and drift in any one of these parameters causes a sensitivity drift.

Sense system 1000 is configured to extract varying capacitance $q_y$ due to y displacement/deflection of sense mass 803. Differential sense electrodes 807a, 807b generate varying capacitance $q_y$, which is converted to an analog voltage signal by C2V converter 1004. The analog voltage signal is demodulated by synchronous demodulator 1003, which is coupled to clock signal clk_vel generated and provided by PLL 1001. Demodulator 1003 extracts an analog rate signal from the analog voltage signal. The analog rate signal is converted to a digital rate signal by ADC 1002 to produce the measured digital rate signal Rate_Out.

Figure 11A:
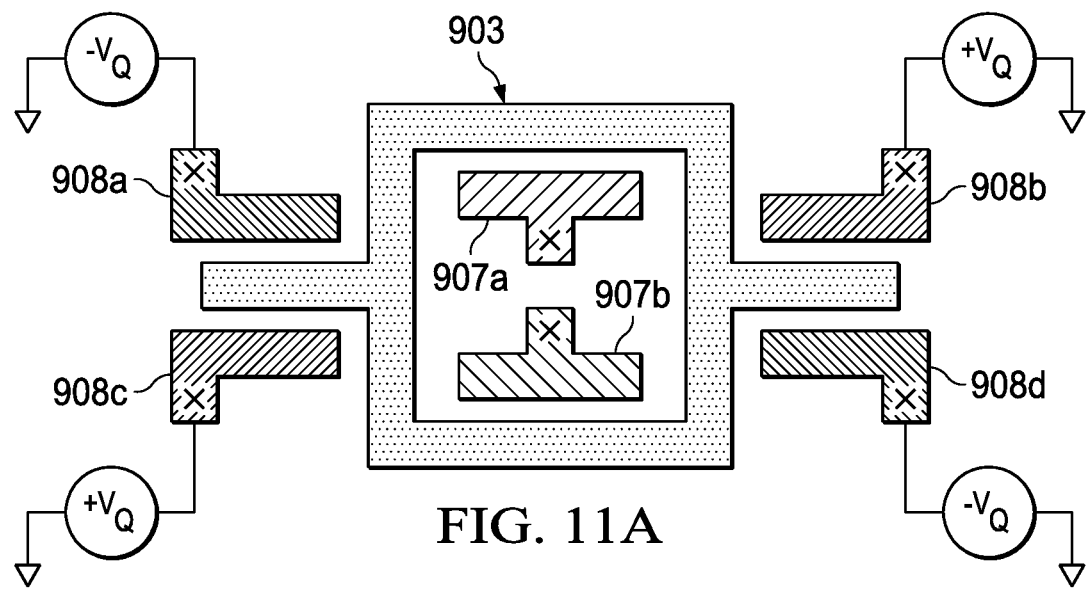
FIGS. 11A and 11B illustrate quadrature tuning, according to an embodiment.
Figure 11B:
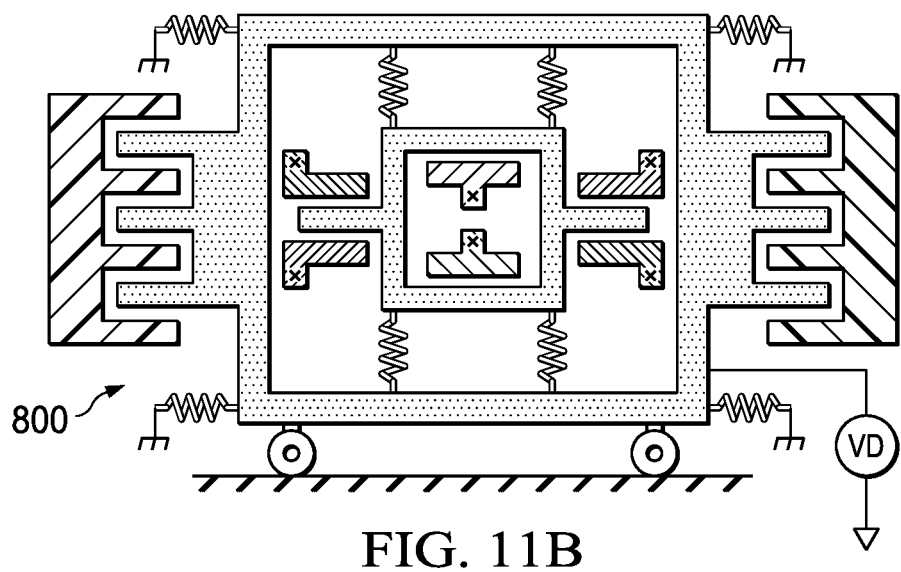

FIGS. 11A and 11B illustrate quadrature tuning, according to an embodiment. Differential DC voltages ($V_Q$, $-V_Q$) are applied to differential electrodes 808a-808d.

Equations [28]-[31] further describe the quadrature tuning by the test electrodes and the subsequent generation of a Rate_Out signal when quadrature tuning voltages $V_Q$ and $-V_Q$ are applied:

$$K = \begin{bmatrix} k_{xx} & k_{xy} \\ k_{xy} & k_{yy} \end{bmatrix}_{Mech} = \sum_{i=1}^{Nelec} \begin{bmatrix} \frac{\delta}{dx}\left(\frac{C_{s\_i}}{dx}\right) & \frac{\delta}{dy}\left(\frac{C_{s\_i}}{dx}\right) \\ \frac{\delta}{dx}\left(\frac{C_{s\_i}}{dx}\right) & \frac{\delta}{dy}\left(\frac{C_{s\_i}}{dx}\right) \end{bmatrix} \Delta V_i^2, \quad [28]$$

$$K = \begin{bmatrix} k_{xx} & k_{xy} \\ k_{xy} & k_{yy} \end{bmatrix}_{Mech} + \frac{4\varepsilon_0}{g^2} \begin{bmatrix} 0 & V_Q V_D thk \\ V_Q V_D thk & -\frac{C_S}{g}(V_D^2 + V_Q^2) \end{bmatrix}, \quad [29]$$

$$y \sim \frac{\left(-j\Omega + \frac{k_{xy} - \frac{4\varepsilon_0 thk}{g^2} V_Q V_D}{m_s f_{DRV}}\right) X}{4\pi^2 \Delta f \left(1 - \frac{\Delta f}{f_{DRV}}\right)}, \quad [30]$$

$$\Delta f \sim \Delta f_0 - f((V_D^2 + V_Q^2)), \quad [31]$$

where $k_{xy}$ is the stiffness along the drive direction, $k_{yy}$ is stiffness along the sense direction, and $k_{xy}$ is a quadrature term due to stiffness coupling between drive and sense. In this approach, the quasi-Coriolis force is generated by the DC voltage and the motion of the drive mass.

In an embodiment, $V_Q$ is applied during initial calibration of the gyroscope to calibrate the output response to voltage transfer function (dps/$V_Q$). Later after installation in a system or in the field, $V_Q$ is applied again and the transfer function is re-calculated. Any changes from initial calibration are due to changes in sensitivity and this delta value is either applied immediately or stored in memory for compensation of the sensitivity. In another embodiment, this technique can be used to extract the phase or sensitivity through a delta quadrature measurement.

Example Processes

Figures 12, 13:
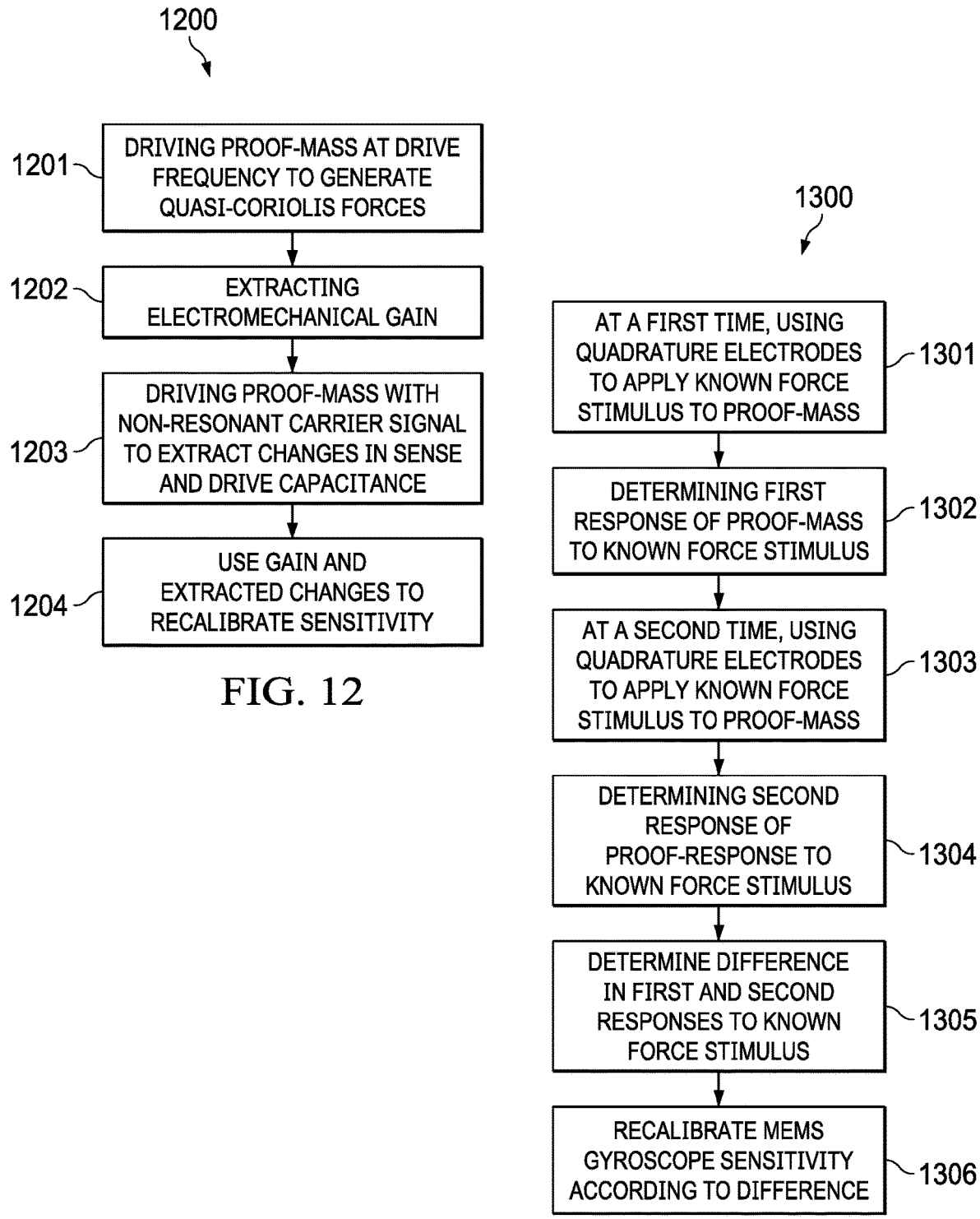
FIG. 12 is flow diagram of a process for calibrating a MEMS based gyroscope using drive feedthrough excitation and capacitance extraction, according to an embodiment
FIG. 13 is flow diagram of a process for calibrating a MEMS based gyroscope using electrostatically induced quadrature, according to an embodiment.

FIG. 12 is flow diagram of process 1200 for calibrating a MEMS based gyroscope using drive feedthrough excitation and capacitance extraction, according to an embodiment. Process 1200 can be implemented using, for example, electronic system 1400 shown in FIG. 14.

Process 1200 can begin by driving a proof-mass of a MEMS based gyroscope at the gyroscope drive frequency to generate quasi-Coriolis forces on the proof-mass (1201). Process 1200 continues by extracting electromechanical gain from the MEMS based gyroscope (1202). Process 1200 continues by driving the proof-mass with a non-resonant carrier signal to extract additional changes in a sense capacitance and a drive capacitance of the MEMS based gyroscope (1203). Process 1200 continues by using the gain and additional changes to recalibrate sensitivity of the MEMS based gyroscope (1204).

FIG. 13 is flow diagram of process 1300 for calibrating a MEMS based gyroscope using electrostatically induced quadrature, according to an embodiment. Process 1300 can be implemented using, for example, electronic system 1400 shown in FIG. 14.

Process 1300 can begin by, at a first time, driving, by quadrature test electrodes a proof-mass of a MEMS based gyroscope at a drive frequency to apply a known force stimulus to the proof-mass (1301). Process 1300 continues by determining a first response of the proof-mass to the known force stimulus (1302). Process 1300 continues by, at a second time after the first time, driving, by the quadrature test electrodes, the proof-mass of the MEMS based gyroscope at the drive frequency to apply the known force stimulus to the proof-mass (1303). Process 1300 continues by determining a second response of the proof-mass to the known force stimulus (1304). Process 1300 continues by determining a difference in first and second responses of the proof-mass to the know force stimulus (1305). Process 1300 continues by using the difference to recalibrate sensitivity of the MEMS based gyroscope (1306).

Example System Architecture

Figure 14:
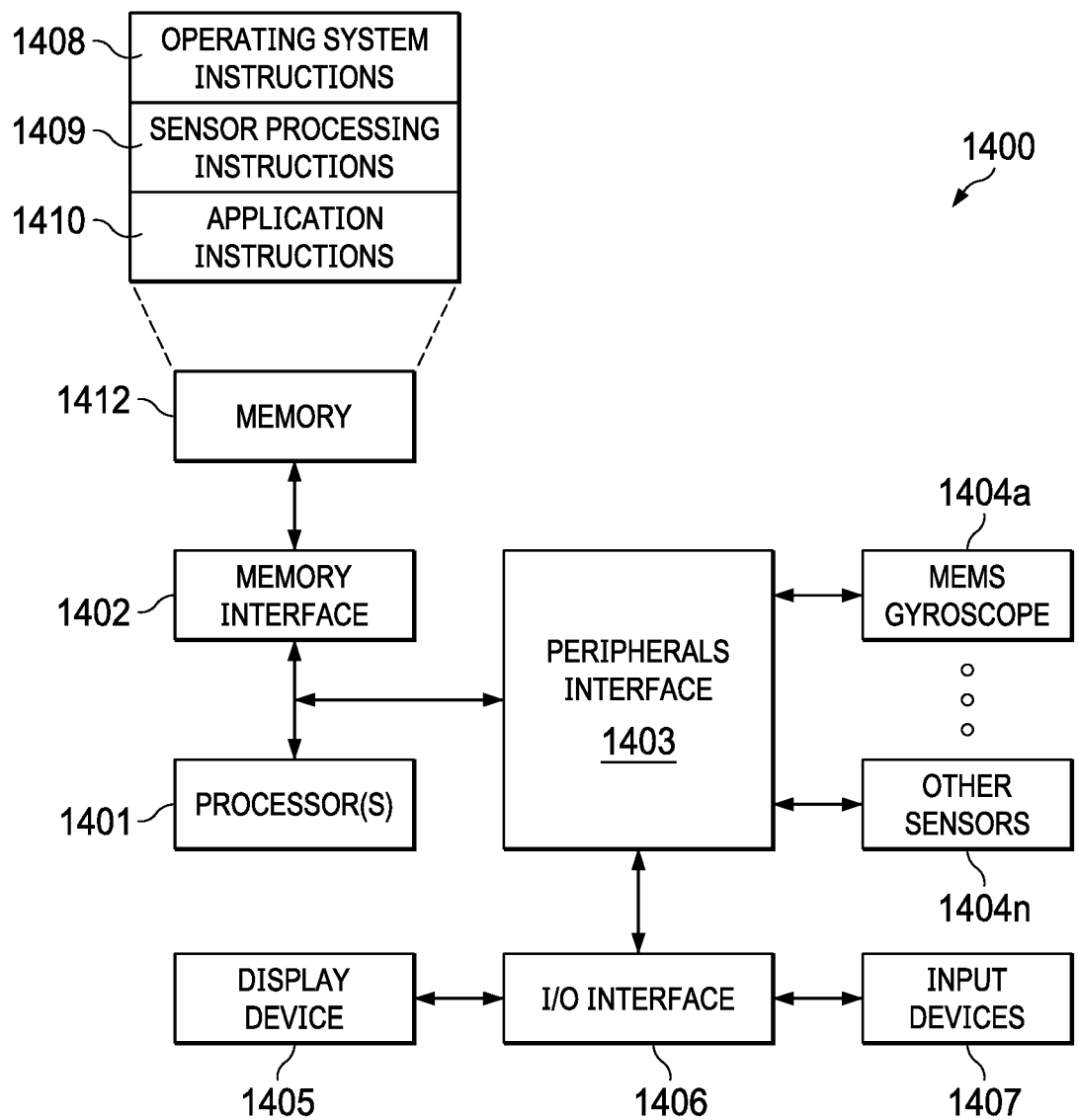
FIG. 14 is a block diagram of an electronic system architecture for implementing the MEMS based gyroscope described in reference to FIGS. 1-6, according to an embodiment.

FIG. 14 is a block diagram of an electronic system architecture for implementing the MEMS based gyroscope described in reference to FIGS. 1-13, according to an embodiment. Architecture 1400 can be included in any electronic device that uses motion sensors, including but not limited to: smartphones, tablet computers, wearable devices (e.g., a smart watch) and automotive systems.

Architecture 1400 includes processor(s), memory interface 1402, peripherals interface 1403, motion sensors 1404a ... 1404n, display device 1405 (e.g., touch screen, LCD display, LED display), I/O interface 1406 and input devices 1407 (e.g., touch surface/screen, hardware buttons/switches/wheels, virtual or hardware keyboard, mouse). Memory 1412 can include high-speed random access memory and/or non-volatile memory, such as one or more magnetic disk storage devices, one or more optical storage devices and/or flash memory (e.g., NAND, NOR).

Memory 1412 stores operating system instructions 1408, sensor processing instructions 1409 and application instructions 1412. Operating system instructions 1408 include instructions for implementing an operating system on the device, such as iOS, Darwin, RTXC, LINUX, UNIX, WINDOWS, or an embedded operating system such as VxWorks. Operating system instructions 1408 may include instructions for handling basic system services and for performing hardware dependent tasks. Sensor-processing instructions 1409 perform post-processing on motion sensor data (e.g., averaging) and provide control signals to motion sensors. Application instructions 1410 implement software programs that use data from one or more motion sensors 1404a ... 1404n, such as navigation, digital pedometer, tracking or map applications. At least one motion sensor 1404a is a capacitive-based MEMS based gyroscope that operates as described in reference to FIGS. 1-13.

For example, in a navigation application executed on a smartphone, angular rate data is provided by the MEMS based gyroscope to processor(s) 1401 through peripheral interface 1403. Processor(s) 1401 execute sensor-processing instructions 1409, to perform further processing of the angular rate data (e.g., averaging). Processor(s) 1401 execute instructions for various applications running on the smartphone. For example, the angular rate data can be used to determine a more accurate orientation of the smartphone in a reference coordinate system (e.g., a direction heading or attitude). The more accurate orientation can be used by the navigation/compass application to perform a variety of navigation functions (e.g., direction heading, turn-by-turn instructions). Other applications are also possible (e.g., gaming applications, camera applications, beamforming, calibrating other sensors).

While this document contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination. Logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A method of calibrating sensitivity of a micro-electrical-mechanical system (MEMS) based gyroscope, comprising:

driving a proof-mass of the MEMS based gyroscope using signals from a drive capacitance-to-voltage (C2V) converter output to generate quasi-Coriolis forces on the proof-mass;

extracting electromechanical gain from the MEMS based gyroscope; and using the gain to recalibrate a sensitivity of the MEMS based gyroscope.

2. The method of claim 1 further comprising:

injecting a non-resonant carrier signal into the proof-mass of the MEMS based gyroscope to extract additional changes in a sense capacitance and a drive capacitance of the MEMS based gyroscope; and using the gain and the additional changes to recalibrate sensitivity of the MEMS based gyroscope.

3. A method of calibrating sensitivity of a micro-electrical-mechanical system (MEMS) based gyroscope, comprising:

at a first time:

driving, by quadrature test electrodes, a proof-mass of the MEMS based gyroscope at a drive frequency to apply a known force stimulus to the proof-mass;

determining a first response of the proof-mass to the known force stimulus;

at a second time after the first time:

driving, by the quadrature test electrodes, the proof-mass of the MEMS based gyroscope at the drive frequency to apply the known force stimulus to the proof-mass;

determining a second response of the proof-mass to the known force stimulus;

determining a difference in first and second responses of the proof-mass to the know force stimulus; and using the difference to recalibrate sensitivity of the MEMS based gyroscope.

4. The method of claim 3 further comprising:

injecting a non-resonant carrier signal into the proof-mass of the MEMS based gyroscope to extract additional changes in a sense capacitance and a drive capacitance of the MEMS based gyroscope; and using the difference and the additional changes to recalibrate sensitivity of the MEMS based gyroscope.

5. A gyroscope sensitivity calibration system, comprising:

a micro-electrical-mechanical system (MEMS) based gyroscope including:

a drive mass;
a sense mass disposed within an opening of the drive mass and configured to move within the opening in response to the drive mass moving along a drive axis;
test electrodes configured to excite the drive mass during a calibration mode of operation;
a drive system configured to generate quasi-Coriolis excitation signals and apply the excitation signals to the test electrodes, wherein the quasi-Coriolis excitation signals excite the drive mass with quasi-Coriolis forces to induce quasi-Coriolis excitation forces on the sense mass; and
a sense system configured to extract a varying capacitance due to displacement of the sense mass in response to the induced quasi-Coriolis excitation forces, and to determine a mechanical sensitivity of the MEMS based gyroscope based on the varying capacitance.

* * * * *